United States Patent
Schuler

(10) Patent No.: US 7,176,519 B2
(45) Date of Patent: Feb. 13, 2007

(54) MEMORY CELL, MEMORY CELL ARRANGEMENT AND METHOD FOR THE PRODUCTION OF A MEMORY CELL

(75) Inventor: Franz Schuler, Dresden (DE)

(73) Assignee: Infineon Technologies AG, Dresden (DE)

(*) Notice: Subject to any disclaimer, the term of this patent is extended or adjusted under 35 U.S.C. 154(b) by 6 days.

(21) Appl. No.: 11/197,803

(22) Filed: Aug. 5, 2005

(65) Prior Publication Data

US 2005/0285182 A1 Dec. 29, 2005

Related U.S. Application Data

(63) Continuation of application No. PCT/DE2004/000186, filed on Feb. 4, 2004.

(30) Foreign Application Priority Data

Feb. 5, 2003 (DE) ................. 103 04 654

(51) Int. Cl.
*H01L 29/788* (2006.01)
*H01L 21/336* (2006.01)

(52) U.S. Cl. ............. 257/315; 257/318; 257/E29.129; 438/257

(58) Field of Classification Search ............... 257/314, 257/315, 321, 324, 509, 520, E29.129, E29.3, 257/E29.304, E29.207, E29.331
See application file for complete search history.

(56) References Cited

U.S. PATENT DOCUMENTS

| | | | |
|---|---|---|---|
| 4,454,646 A | 6/1984 | Joy et al. | |
| 5,515,319 A | 5/1996 | Smayling et al. | |
| 6,078,074 A | 6/2000 | Takebuchi et al. | |
| 6,329,246 B1 | 12/2001 | Lee | |
| 6,366,499 B1 | 4/2002 | Wang et al. | |
| 6,518,126 B2 | 2/2003 | Wu et al. | |
| 2002/0008273 A1* | 1/2002 | Kumazaki | 257/314 |
| 2003/0006448 A1 | 1/2003 | Mehrad et al. | |

FOREIGN PATENT DOCUMENTS

EP 0073 370 A2 3/1983

* cited by examiner

*Primary Examiner*—Minhloan Tran
*Assistant Examiner*—Benjamin Tzu-Hung Liu
(74) *Attorney, Agent, or Firm*—Brinks Hofer Gilson & Lione

(57) ABSTRACT

A memory cell, memory cell arrangement, and method for producing a memory cell arrangement is described where electric charge carriers can be introduced from a trench structure, which delivers charge carriers, into a charge storage area by applying a predefined electrical potential to the cell. The memory cell provides for programming with a reduced energy requirement

25 Claims, 10 Drawing Sheets

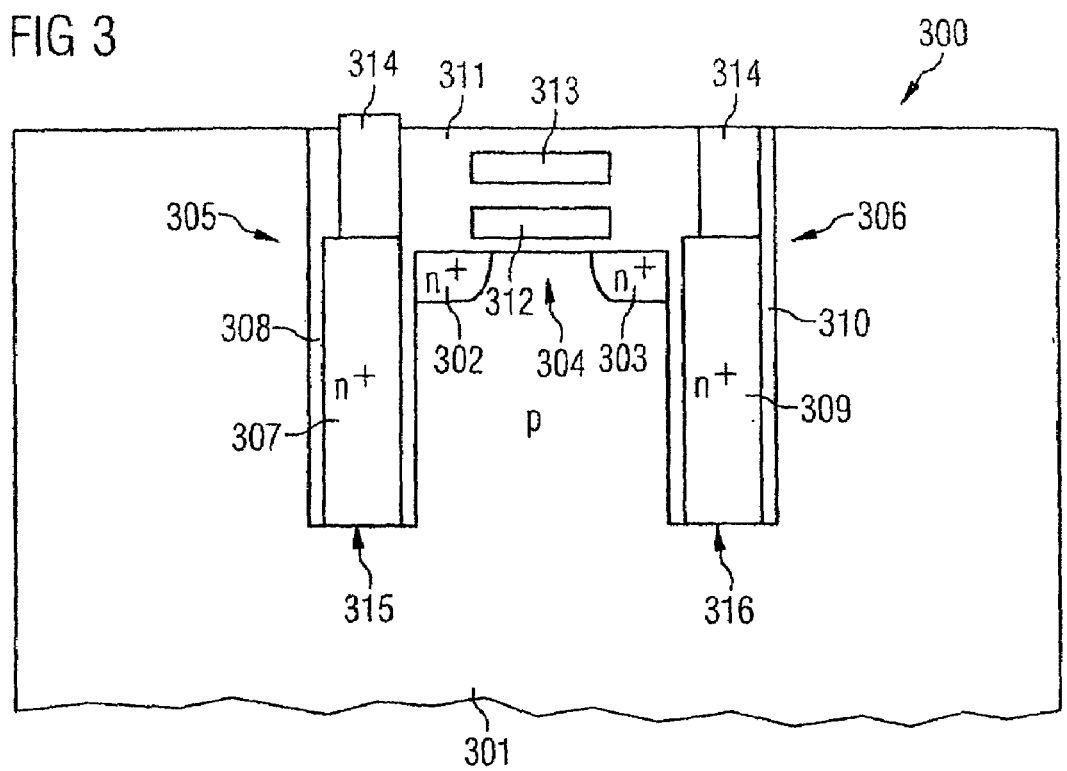
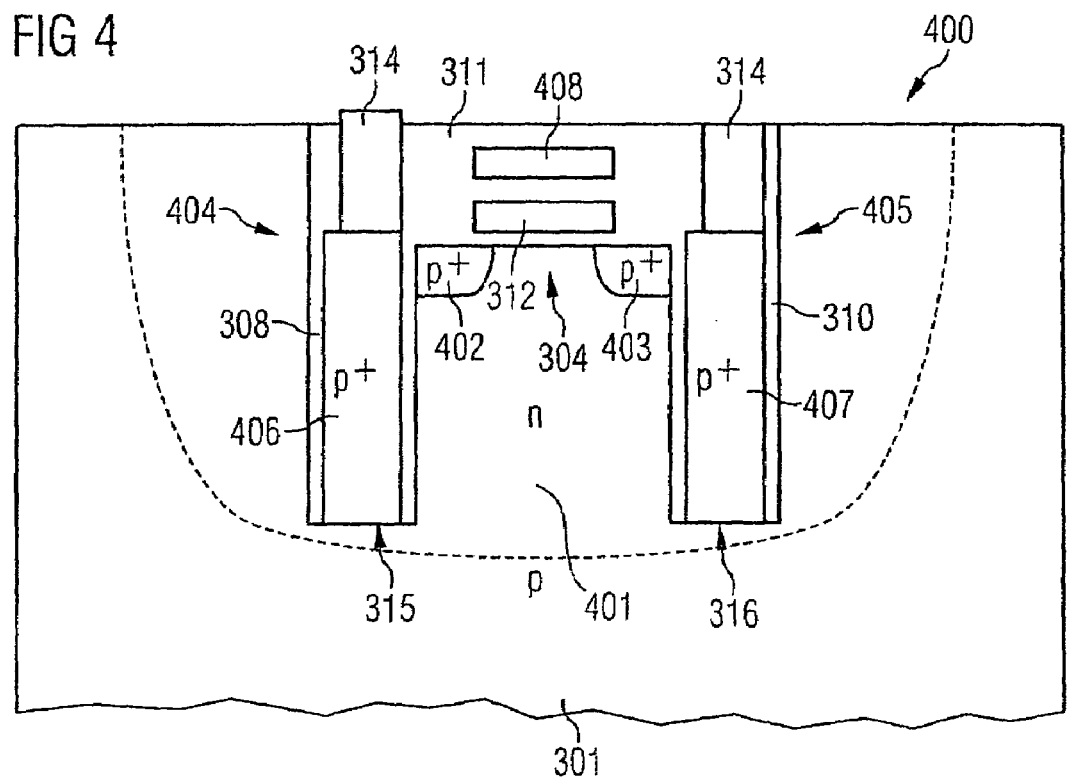

MEMORY CELL, MEMORY CELL ARRANGEMENT AND METHOD FOR THE PRODUCTION OF A MEMORY CELL

PRIORITY AND CROSS REFERENCE TO RELATED APPLICATION

This application is a continuation of International Application No. PCT/DE2004/000186 filed Feb. 4, 2004, which claims priority to German application 103 04 654.2 filed Feb. 5, 2003, both of which are incorporated herein in their entirety by reference.

BACKGROUND

1. Field of the Invention

The present invention relates to the field of integrated circuit memory storage devices, and more particularly, it relates to a memory cell arrangement and production of memory cell arrangements.

2. Description of the Related Art

In view of the rapid development in computer technology, there is a demand for ever faster, denser and better programmable, erasable and readable memory cells.

A nonvolatile so-called channel hot electron (CHE) memory cell has a field effect transistor with an electrically conductive floating gate layer between a gate insulating layer and a control gate. Electrical charge carriers are introduced into the CHE memory cell by the injection of hot channel electrons. The information that is stored in the CHE memory cell is coded according to the presence or the absence of charge carriers in the floating gate layer. One or more "hot", or sufficiently greatly accelerated, electrons or holes in the vicinity of a drain region can pass through the gate insulating layer into the floating gate layer. On account of an electrically insulating region surrounding the floating gate, the introduced electrical charge carriers are protected against flowing away from the floating gate layer and thus remain permanently in the floating gate layer.

FIG. 1 illustrates a known floating gate memory cell 100. The floating gate memory cell 100 is integrated in a p-doped silicon substrate 101. An n-doped well 102 is formed in the p-doped silicon substrate 101. A p-doped well 103 is formed in the n-doped well 102. A first source/drain region 104 is formed as an $n^+$-doped region in a first surface region of the p-doped well 103. Furthermore, a second source/drain region 105 is formed as an $n^+$-doped region in a second surface region of the p-doped well 103. A channel region 106 is formed in the surface region of the p-doped well 103 between the source/drain regions 104, 105. By means of an electrically insulating region 107, a floating gate region 108 arranged above the channel region 106 is electrically insulated from the channel region 106, and a control gate 109 arranged above the floating gate region 108 is electrically insulated from the floating gate region 108. By means of Shallow Trench Isolation ("STI") regions 110 arranged laterally with respect to the floating gate memory cell 101, the floating gate memory cell 100 is electrically decoupled from adjacent memory cells (not shown in FIG. 1) of a memory cell arrangement. By means of contact-connection elements 111, a predeterminable electrical potential can in each case be applied to the source/drain regions 104, 105 and to the control gate 109. A pn junction 112 is formed between the n-doped well 102 and the p-doped well 103.

In order to introduce electrical charge carriers into the floating gate 108 of the nonvolatile floating gate memory cell 100, hot electrons are injected from the substrate using a pn junction 112 that is electrically biased in the forward direction. For this purpose, the control gate 109 is brought to a positive electrical potential having a sufficiently large magnitude. On account of the (capacitive) coupling of the floating gate 108 and the control gate 109, said electrical potential also acts on the floating gate 108. The pn junction 112 between the n-doped well 102 and the p-doped well 103 is electrically biased in such a way that electrons are injected from the n-doped well 102 into the p-doped well 103. On account of the positive potential at the floating gate 108, electrons are accelerated to the channel region 106 and can be injected into the floating gate 108 through the gate insulating layer formed by means of the electrically insulating region 107.

An item of information can be programmed into the memory cell 100. The floating gate memory cell 100 of FIG. 1 has the disadvantage that the entire pn junction 112 has to be biased across a large lateral width. This leads to high energy consumption during programming, erasing and reading of the memory cell 100, which is disadvantageous in particular for low-power applications.

FIG. 2 illustrates a test arrangement 200 that is known for examinations of the reliability of components. In particular, the test arrangement 200 serves for checking the quality or reliability of a gate insulating layer in a field effect transistor formed beforehand. The test arrangement 200 is integrated on and in a p-doped silicon substrate 201, where a field effect transistor 202 is integrated in the test arrangement 200. The field effect transistor contains a first source/drain region 203 formed in a first surface region of the p-doped silicon substrate 201 and a second source/drain region 204 formed in a second surface region of the p-doped silicon substrate 201. Both source/drain regions 203, 204 are $n^+$-doped regions. A channel region 208 is formed between the two source/drain regions 203, 204. A gate region 206 is formed above the channel region 208 and is electrically isolated from the channel region 208 by means of a gate insulating layer, which is part of an electrically insulating region 205. Provision is made of contact-connection elements 207 for applying defined electrical potentials to the source/drain regions 203, 204 and to the gate region 206. Laterally with respect to the field effect transistor 202, an additional $n^+$-doped region 209 is provided in another surface region of the silicon substrate 201 and can be driven electrically by means of another contact-connection element 210. As indicated schematically in FIG. 2, electrical charge carriers, namely electrons, can be injected from the $n^+$-doped region 209 via the p-doped silicon substrate 201 and the channel region 208 through the gate insulating layer possibly right into the gate region 206 by means of the application of 0V or a positive electrical potential to the source/drain regions 203, 204 and a stronger positive electrical potential in comparison with said positive potential to the gate region 206 and also a negative electrical potential to the $n^+$-doped region 209.

The test arrangement of FIG. 2 is only suitable for testing the functionality of a field effect transistor 202 formed using semiconductor-technological processing, in particular for testing the functionality of the gate insulating layer of the field effect transistor. The test arrangement 200 leads to very large area consumption on a silicon substrate 201.

BRIEF SUMMARY OF THE INVENTION

By way of introduction only, a memory cell, memory cell arrangement and method for the production of memory cells are described, including uses of the method and a memory cells.

A memory cell, a memory cell arrangement, and a method for the production of a memory cell provide for programming with a reduced energy requirement. The memory cell includes a substrate having charge carriers of a first conduction type, a first source/drain region in a first surface region of the substrate, and a second source/drain region in a second surface region of the substrate. A channel region is formed in a surface region of the substrate between the first and the second source/drain region. A charge storage region is formed above the channel region and a control gate is formed above the charge storage region, which control gate is electrically insulated from the charge storage region. A trench structure is formed in the substrate, which trench structure has charge carrier supplying material with charge carriers of a second conduction type and an insulation region between the substrate and at least one part of the charge carrier supplying material. The first conduction type is different from the second conduction type, so that a diode junction, a pn junction or an np junction when using a semiconductor material as charge carrier supplying material, depending on the doping, or a Schottky diode when using e.g. a metal such as tungsten, is formed between the substrate and the charge carrier supplying material of the trench structure. The memory cell may be set up so that by the application of predeterminable electrical potentials to the memory cell, electrical charge carriers can be introduced from the charge carrier supplying material of the trench structure into the charge storage region.

A memory cell arrangement includes a plurality of memory cells having the abovementioned features which are integrated in the substrate. In the case of the method for the production of a memory cell, a first source/drain region is formed in a first surface region of a substrate having charge carriers of a first conduction type, and a second source/drain region is formed in a second surface region of the substrate. A channel region is formed in the surface region of the substrate between the first and the second source/drain region. A charge storage region is formed above the channel region. A control gate is formed above the charge storage region, which is electrically insulated from the charge storage region. A trench structure arranged in the substrate is formed, to have charge carrier supplying material with charge carriers of a second conduction type and an insulation region between the substrate and at least one part of the charge carrier supplying material. The first conduction type is set such that it is different from the second conduction type, so that a diode junction is formed between the substrate and the charge carrier supplying material of the trench structure. The memory cell is also set up in such a way that by the application of predeterminable electrical potentials to the memory cell, electrical charge carriers can be introduced from the charge carrier supplying material of the trench structure into the charge storage region.

The foregoing summary is provided only by way of introduction. The features and advantages of memory cell may be realized and obtained by means of the instrumentalities and combinations particularly pointed out in the claims. Nothing in this section should be taken as a limitation on the claims, which define the scope of the invention. Additional features and advantages of the present invention will be set forth in the description that follows, and in part will be obvious from the description, or may be learned by practice of the present invention.

DESCRIPTION OF THE DRAWINGS

FIG. 3 shows an exemplary first embodiment of a memory cell.

FIG. 4 shows an exemplary second embodiment of a memory cell.

DETAILED DESCRIPTION OF THE INVENTION

Figure 1:
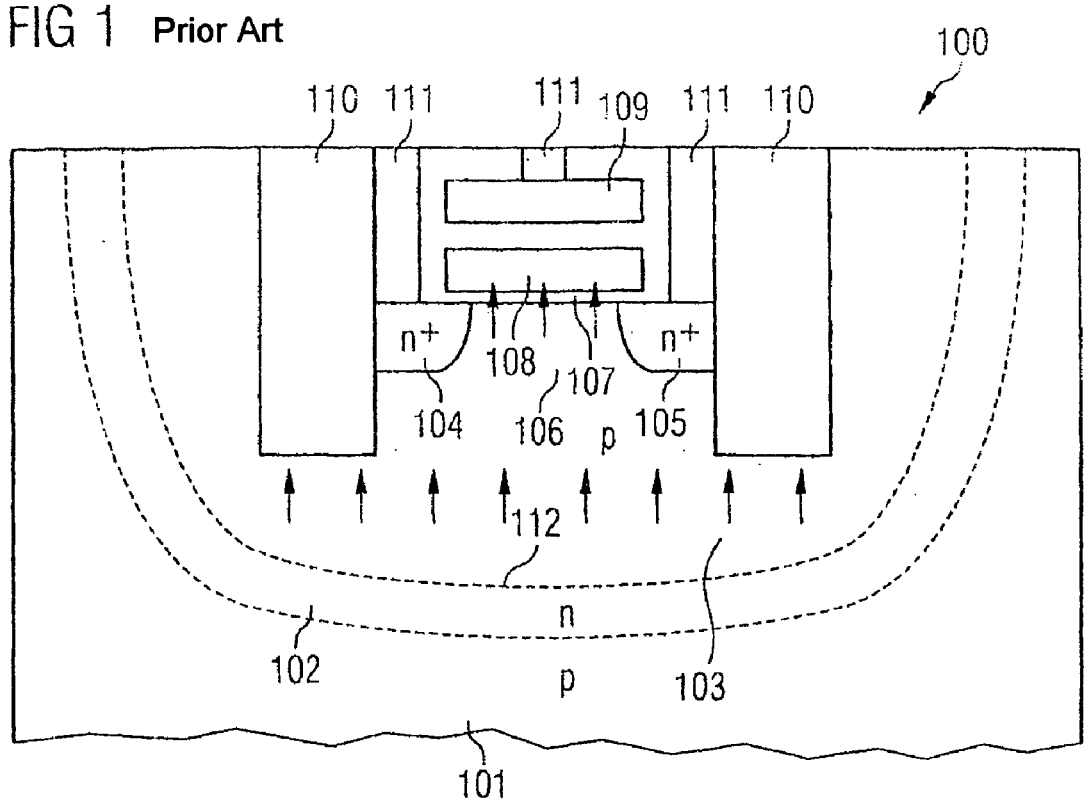
FIG. 1 shows a prior art memory cell.
Figure 2:
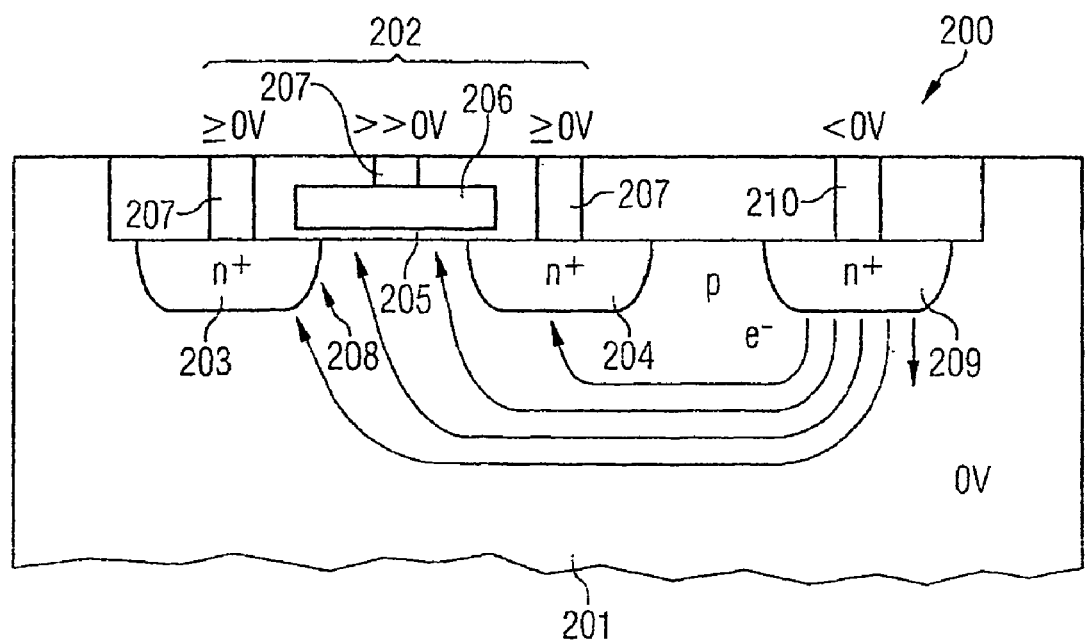
FIG. 2 shows a prior art test arrangement.

A memory cell, memory cell arrangement and method of producing memory cells will now be described more fully with reference to the accompanying drawings. In each of the following figures, components, features and integral parts that correspond to one another each have the same reference number. The drawings of the figures are not true to scale.

In view of the demand for high-density and reliably programmable memory cells, the small space requirement of the memory cell constitutes an important advantage. The memory cell may be set up for the injection of hot electrical charge carriers (electrons or holes) from the trench structure via a substrate right into the charge storage layer. The emitter for emitting electrical charge carriers is embedded in a trench with at least partial sidewall insulation. The memory cell may be realized as an n-channel memory cell or as a p-channel memory cell. The concomitant use of an STI isolation filled with electrically conductive material as a structure for feeding charge carriers for injection into a charge storage region is a particularly space-saving solution.

In an integrated memory cell, a trench having an increased charge carrier concentration may be created as a supplier of charge carriers for injection into a charge storage region of the memory cell. The injection may be effected by means of the application of predeterminable electrical potentials to the terminals of the memory cell, in particular to the trench structure and/or the substrate layer and the control gate. The memory cell can be implemented in highly space-saving fashion since the Shallow Trench Isolation (STI) that usually occurs in memory cells for decoupling adjacent memory cells of a memory cell arrangement can clearly be hollowed out and filled with an electrically conductive material (e.g., in n$^+$-doped polysilicon). The trench structure thereby formed can then be used, on the one hand, as insulation from adjacent components in the substrate and, on the other hand, as a charge carrier emitter integrated sufficiently deep in a substrate, without the space requirement thereby being increased.

The conduction type (p-conducting or n-conducting in the case of a semiconductor material) of the charge carriers (doping atoms in the case of a semiconductor material) in the substrate, on the one hand, and in the charge carrier supplying material of the trench structure, on the other hand, is different, i.e. complementary to one another (for example p-conducting substrate and n-conducting or metallic charge carrier supplying material of the trench structure or n-conducting substrate and p-conducting charge carrier supplying material of the trench structure). Consequently, a diode junction (pn junction or Schottky junction) is formed in a junction region or interface region between the substrate and the charge carrier supplying material of the trench structure.

Application of suitably chosen electrical potentials to the trench structure and the control gate then makes it possible to operate the diode in the interface region in the forward direction, and thus to inject electrical charge carriers of the charge carrier supplying material into the substrate through to the charge storage region, which charge carriers are accelerated upon passing through the substrate on account of an electrical voltage applied to the control gate and can thus be introduced permanently into the charge storage region.

The memory cell provides the advantage, in particular, that a uniform charge carrier injection into a charge storage layer is made possible, which leads to reduced degradation of the charge storage layer. Furthermore, a local injection directly in an adjacent region of a memory cell is made possible since the current paths of the charge carriers in the substrate are predeterminable by means of the application of suitable potentials to the terminals of the memory cell. The local injection of charge carriers in a memory cell leads to a low energy requirement and the possibility of addressing individual cells. Furthermore, the emitter of the electrical charge carriers is embedded in a trench, which leads to a small space requirement. The trench structure may extend deeper into the substrate than the first and the second source/drain region. This ensures that electrical charge carriers can be introduced into the charge storage layer very homogeneously. This increases the lifetime of the memory cell, in particular of the charge storage layer. Where the components of the memory cell are integrated in a well formed in the substrate and having a predetermined conduction type, the vertical depth of the trench structure may not exceed the depth of the well region in the substrate. The trench structure preferably extends essentially in a vertical direction with respect to the surface of the substrate and may be formed laterally with respect to at least one of the source/drain regions and outside the channel region.

The memory cell also may have two (or more) trench structures in the substrate, of which one is arranged laterally with respect to the first source/drain region and outside the channel region and the other is arranged laterally with respect to the second source/drain region and outside the channel region. This configuration is symmetrical, thereby enabling electrical charge carriers to be injected into the charge storage layer particularly homogeneously. Furthermore, by means of two symmetrically arranged trench structures, by means of their insulation regions, the memory cells may be electrically decoupled toward both sides from components possibly arranged in adjacent regions of the substrate, in order to avoid an undesirable electrical interaction between such components and the memory cell. Other integrations are also conceivable (e.g. NAND architectures).

The trench structure may have an electrically insulating sheath region on at least one part of the sidewall of the trench and an electrically conductive core region filled into the trench, in such a way that electrical charge carriers can emerge from the trench structure into the substrate only from those regions in which the core region is free of a sheathing with the sheath region, or from those regions in which the sheath region has a sufficiently small thickness to enable a tunneling current of charge carriers from the charge carrier supplying material through the sheath region into the substrate. The trench structure may be produced, for example, by first forming a trench in the substrate. Afterward, e.g. in a deposition method or by means of thermal oxidation, an insulation layer is formed on the sidewall of the trench and the bottom thereof. Afterward, for example by means of an anisotropic etching step (e.g. by means of reactive ion etching (RIE)), the insulation layer is at least partially removed from the bottom of the trench and/or from the sidewall thereof in the lower region. The trench is subsequently filled with the charge carrier emitting material, as a result of which a diode junction is formed in the contact region. Proceeding from the bottom region of the trench, charge carriers can then be introduced from the trench structure into the substrate. By way of example, in situ doped polysilicon material or a metal is filled into the cavity introduced in the trench, as a result of which the trench structure is formed.

A partial region of the charge carrier supplying material of the trench structure directly adjoins material of the substrate. However, it is also possible for insulation material having a sufficiently small thickness (typically less than 2 mm) to remain or be formed or introduced between the substrate and the charge carrier supplying material of the trench structure. In this case, when suitable electrical potentials are applied to the trench structure and the control gate, electrical charge carriers can tunnel through the thin electrically insulated layer.

The charge storage region may be a floating gate formed of polysilicon. A gate insulating layer for electrically insulating the channel region from the floating gate may be provided between the substrate and the floating gate. In addition or alternatively, the charge storage region may be an electrically insulating charge storage region. A silicon oxide/silicon nitride/silicon oxide layer sequence (ONO layer sequence) may be used as the electrically insulating charge storage region. The silicon nitride layer also may be replaced by a material such as e.g. aluminum oxide ($Al_2O_3$), yttrium oxide ($Y_2O_3$), lanthanum oxide ($LaO_2$), hafnium oxide ($HFO_2$) and/or zirconium oxide ($ZrO_2$). A silicon oxide/aluminum oxide/silicon oxide layer sequence, a silicon oxide/yttrium oxide/silicon oxide layer sequence, a silicon oxide/lanthanum oxide/silicon oxide layer sequence, a silicon oxide/hafnium oxide/silicon oxide layer sequence, a silicon oxide/zirconium oxide layer sequence and/or some other layer sequence which enables a permanent charge storage is possible. Such an electrically insulating charge storage region is also referred to as a charge trapping layer. By way of example, when an ONO layer sequence is used, electrical charge carriers are injected into the silicon nitride layer of the ONO layer sequence and are stored there permanently in particular in defects.

The substrate may have a well region having the charge carriers, in particular doping atoms of the first conduction type and a region having charge carriers, in particular doping atoms of the second conduction type, the components of the memory cell being formed in the well region. A homogeneous substrate need not necessarily be used as substrate of the memory cell according to the invention. It is possible, for example, to form an n-doped well region in a p-doped substrate and to form the memory cell according to the invention in the well region. A multiple well structure having clearly well regions that are nested in one another and having different conduction types is also possible (for example an n-type well in a p-type substrate and p-type well in the n-type well).

The memory cell may have a plurality of control gates that are spatially separated and can be electrically driven separately, in such a way that, by means of the application of predeterminable electrical potentials to at least one selected control gate from said control gates, electrical charge carriers can be introduced from the trench structure into a region of the charge storage region that is adjacent to the at least one selected control gate. A plurality of field effect transistors may be formed next to one another in the substrate in the memory cell according to the invention. Each of the transistors is assigned a dedicated control gate. Furthermore, a common charge storage layer may be provided for all the field effect transistors; as an alternative, each transistor may have a dedicated charge storage layer.

In another aspect, a memory cell of the invention may have only one field effect transistor, in the charge storage region of which charge carriers can be introduced in each case into two spatially separated sections, in which case each of the sections may be assigned a control gate that can be driven separately. In such a case, an item of information of one bit can be stored in each of the sections, so that a plurality of bits can be stored in a field effect transistor. Consequently, the memory cell according may be set up in such a way that a plurality of bits of information can be stored in the memory cell. With the use of n control gates, n bits of information can be stored in the charge storage layer.

Such a multiple-bit memory cell may be programmed, for example, as described below. First of all, for example by means of the injection of hot charge carriers in accordance with the invention, it is possible to erase all information from the charge storage layer or the charge storage layers of the at least one field effect transistor, which clearly corresponds to a resetting of the memory contents. This may be affected for example by the fact that hot electrons can be introduced into the entire charge storage layer. Afterward, each region—assigned to a respective control gate—of the charge storage layer can be programmed separately for example by means of Fowler-Nordheim tunneling, i.e. with particularly good spatial resolution and thus in a manner restricted to a very specific region of the charge storage layer. Consequently, the memory cell of the invention may be set up as a high-density storage medium. The charge carriers of the first conduction type and/or the charge carriers of the second conduction type may be doping atoms. This configuration relates in particular to realizations of the memory cell using a semiconductor material for the substrate and/or the charge carrier supplying material.

A memory cell arrangement may be designed so that different memory cells are electrically decoupled from one another by means of the electrically insulating sheath regions. This configuration corresponds to the realization of the trench structure using an STI structure which is clearly hollowed out and which, apart from its insulation function, additionally fulfills the function of a charge carrier feeding structure for the injection of electrical charge carriers into the substrate.

In a method for the production of the memory cell, it is possible to produce the trench structure and then to produce the source/drain regions, and also the gate structure (i.e. charge storage region and control gate). The trench structure may be formed by forming at least one trench in the substrate, forming an electrically insulating sheath region at least on at least one part of the surface of the at least one trench, and forming an electrically conductive core region in the at least one trench. It is possible, by way of example, firstly to introduce a trench into the substrate and subsequently to form an electrically insulating sheath region. This may be affected for example by generating an electrically insulating layer by means of thermal oxidation of the sidewall of the trench. Charge carrier supplying material, e.g. doped polysilicon, may subsequently be introduced into the arrangement obtained, as a result of which the trench structure is formed.

As an alternative, the trench may be filled with electrically insulating material and the latter may be partially removed from the trench using a lithography and an etching method. In the case of the method, the trench structure may thus be formed by forming at least one trench in the substrate and filling the trench with electrically insulating material. A part of the electrically insulating material is removed from the trench, as a result of which the electrically insulating sheath region is formed. An electrically conductive core region is formed in the at least one trench.

Referring to FIG. 3, a memory cell 300 in accordance with a first exemplary embodiment is illustrated. The memory cell 300 is formed on and/or in a p-doped silicon substrate 301. A first source/drain region 302 is formed as an $n^+$-doped region in a first surface region of the p-doped silicon substrate 301. A second source/drain region 303 is formed as an $n^+$-doped region in a second surface region of the p-doped silicon substrate 301. A channel region 304 of the floating gate arrangement 300 is formed in the surface region between the first and second source/drain regions 302, 303. A first trench structure 305 is formed in the substrate 301, laterally with respect to the first source/drain region 302 and outside the channel region 304, which trench structure contains a first $n^+$-doped polysilicon core 307 and a first silicon oxide sheath 308 partially formed around the latter. A second trench structure 306 is formed in the substrate 301, laterally with respect to the second source/drain region 303 and outside the channel region 304. The second trench structure contains a second $n^+$-doped polysilicon core 309 and second silicon oxide sheath 310 surrounding the core 309. By way of an electrical insulation region 311 made of silicon oxide material, the channel region 304 is electrically isolated from the floating gate 312 made of polysilicon material. By way of the electrical insulation region 311, the control gate 313 formed above the floating gate 312 is electrically isolated from the floating gate 312.

Contact-connection elements 314 may be realized as vias and enable a predeterminable electrical potential to be provided to the trench structures 305, 306. A first pn junction 315, e.g., a first diode junction, is created between the first $n^+$-doped polysilicon core 307 and the p-doped substrate 301. A second pn junction 316 is realized between the second $n^+$-doped polysilicon core 309 and the p-doped silicon substrate 301.

On account of the silicon oxide sheaths 308, 310, the trench structures 305, 406 have an electrical insulation of the memory cell shown in FIG. 3 from other components, for example of other memory cells, possibly formed in adjacent partial regions of the substrate 301.

Realization possibilities based on a p-type substrate are described in FIG. 3 to FIG. 8. The same realization variants are also possible on an n-type substrate (opposite dopings for substrate, wells, trench filling, and source/drain). Instead of an $n^+$-type filling of the trench, it is also possible to use a metallic filling, e.g. made of tungsten material.

Figure 9:
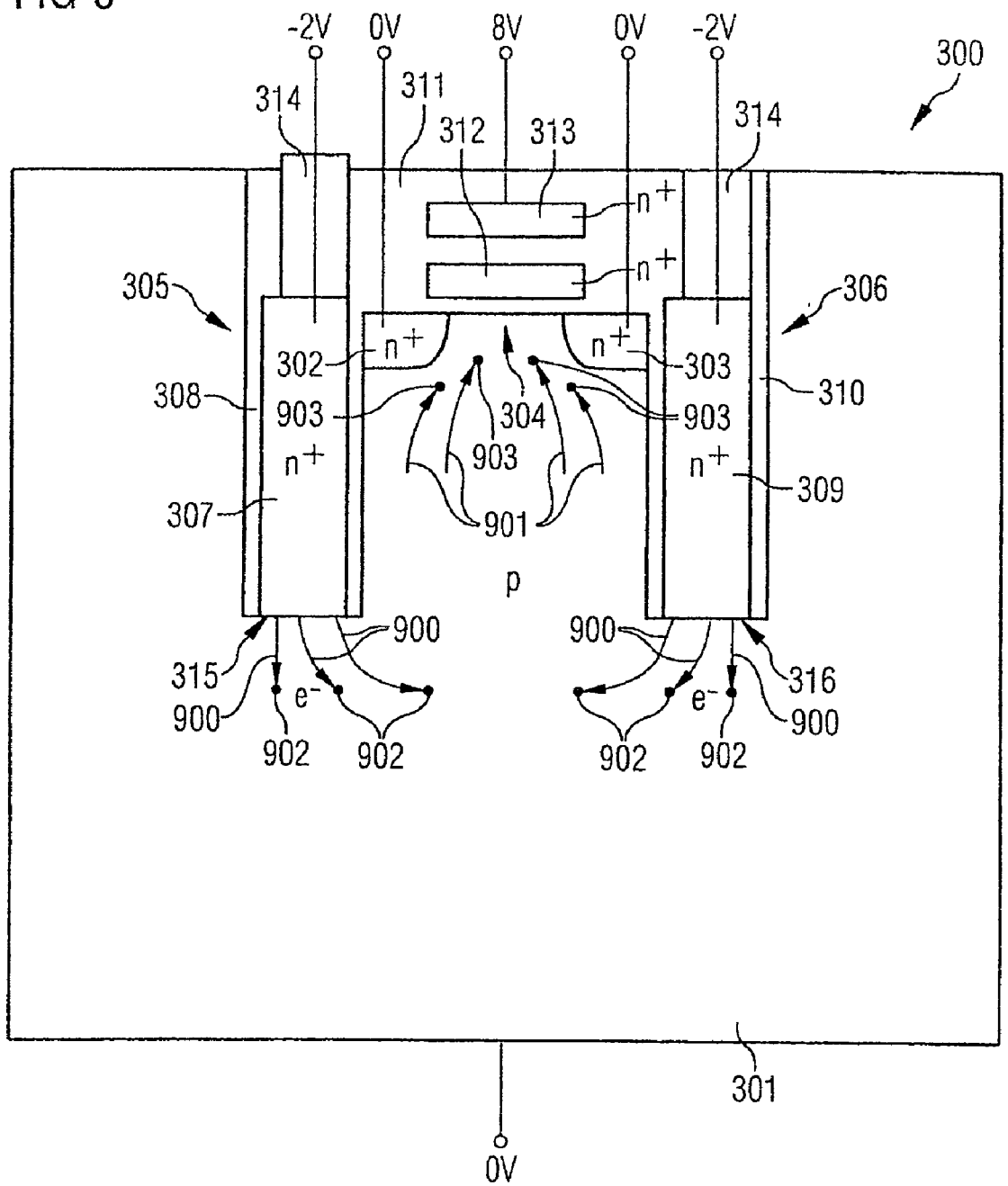
FIG. 9 shows the exemplary memory cell of FIG. 3 in an operating state for the introduction of electrons into the charge storage region.

A description is given below, referring to FIG. 3, FIG. 9, of how electrical charge carriers can be introduced into the $n^+$-doped floating gate 312 made of polysilicon as charge storage region, that is to say how an item of information can be programmed into the memory cell 300. In order to write an item of memory information to the nonvolatile memory cell 300, (e.g., in order to introduce and store electrons into the floating gate 312), as shown in FIG. 9, the first and second $n^+$-doped polysilicon cores 307, 309 are brought to a negative electrical potential (e.g., −2 volts). The source/drain regions 302, 303 are held at the potential of the substrate. A positive electrical potential (e.g. +8 volts) is applied to the control gate 313 (which may be, but need not be, $n^+$-doped). In the example, a doping of the gate regions is not of particular significance, and no stipulation of a specific doping type is described. The p-doped silicon substrate 301 may be held at the electrical ground potential.

Under the potential conditions described, electrons can emerge into the substrate 301 from the first $n^+$-doped polysilicon core 307 of the trench structure 305 and from the second $n^+$-doped polysilicon core 309 of the second trench structure 306 at the pn junctions 315, 316 with the p-doped substrate 301. It should be noted that, in those regions in which the p-doped substrate 301 is isolated from the $n^+$-doped polysilicon cores 307, 308 by means of the silicon oxide sheath regions 308, 310, an emergence of electrical charge carriers is avoided unless the thickness of the electrically insulating sheath regions 308, 310 is so thin that an electrical tunneling current is made possible. First electrons 902 are injected into the silicon substrate 201 on account of the diodes 315, 316 biased in the forward direction, as is indicated by means of first current paths 900.

On account of the strong positive bias of the control gate 313, the injected negatively charged first electrons 902 are accelerated toward the channel region 304 of the p-doped substrate 301, which is illustrated by means of second current paths 901. The accelerated "hot" second electrons 903 can then pass through the gate insulating layer of the electrical insulation region 311, (e.g., between channel region 304 and floating gate 312), can be injected into the floating gate 312 and remain there substantially permanently.

In a first operating state, in which the floating gate 312 is substantially free of electrical charge carriers, the floating gate memory cell 300 has a different threshold voltage than in a scenario in which electrical charge carriers are injected in the floating gate 312. Clearly, electrons contained in the floating gate 312 act in a similar manner to an external electrical voltage applied to the control gate 313, so that the intensity of a current flow between the source/drain regions 302, 303 at a fixed voltage applied between the latter is dependent on whether or not electrical charge carriers are injected in the floating gate 312. The intensity of such a read current contains information with a logic value "1" (e.g. electrons present in floating gate 312) or a logic value "0" (e.g. electrons not present in floating gate 312).

FIG. 4 illustrates a second exemplary embodiment of a memory cell 400. As shown in FIG. 4, the memory cell 400 includes conduction types of the doped regions are formed differently than in the case of the memory cell 300. The memory cell 400 has a p-doped silicon substrate 301. An n-doped well region 401, which may also be referred to as a high-voltage n-type well region, is formed in the p-doped silicon substrate 301. As first and second source/drain regions 402, 403, $p^+$-doped regions are formed in the first and second surface regions of the n-type well region 401. Furthermore, first and second trench structures 404, 405 are provided, which differ from the first and second trench structures 305, 306, from FIG. 3 to the effect that first and second $p^+$-doped polysilicon cores 406, 407 of the trench structures 404, 405 are produced from $p^+$-doped polysilicon instead of from $n^+$-doped polysilicon as in FIG. 3. The $n^+$-doped control gate provided in FIG. 4 may alternatively or in addition be realized as a $p^+$-doped control gate. In the memory cell 400, the junction between the first $p^+$-doped polysilicon core 406 and the n-type well region 401 forms a first diode 315, and the junction between the second $n^+$-doped polysilicon core 407 and the n-type well region 401 forms a second diode 316.

Figure 10:
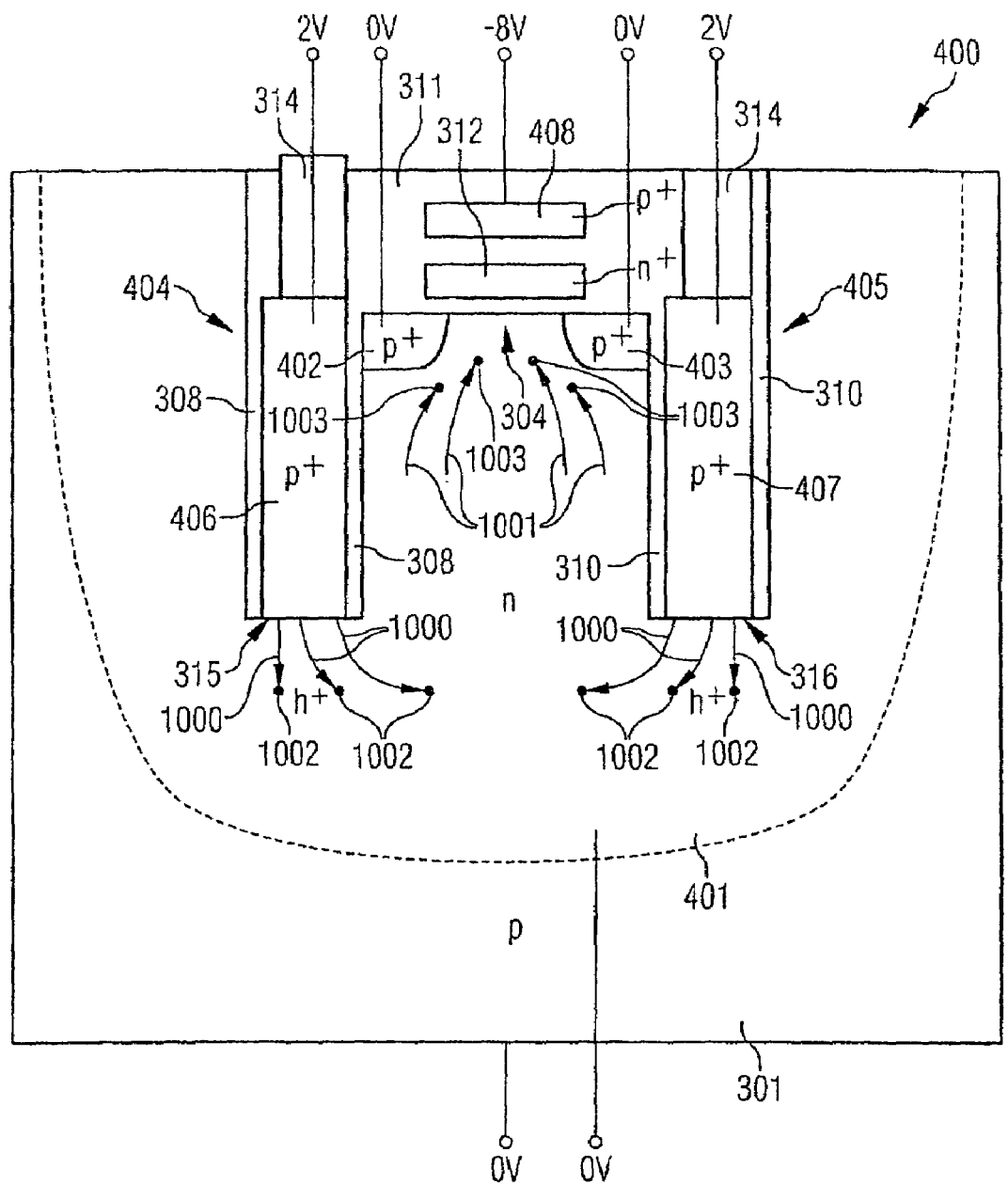
FIG. 10 shows the exemplary memory cell of FIG. 4 in an operating state for the introduction of holes into the charge storage region.

The functionality of the memory cell 400 is described below referring to FIG. 4 and FIG. 10. FIG. 10 shows potentials that may be applied to the terminals of the memory cell 400 in order to inject hot holes (designated by $h^+$ in the figures) into the floating gate 312. For this purpose, the first and second $p^+$-doped polysilicon cores 406, 407 are brought to a potential of e.g. +2 volts. The source/drain terminals 402/403 are held at the potential of the n-type well 401. The terminals of the p-doped substrate 301 and of the n-type well region 401 are preferably held at the electrical ground potential. By contrast, the control gate 408 is brought to a negative potential of e.g. −8 volts. The n-type well may be put at a positive potential and all other applied potentials are to be seen in relation to this positive n-type well potential. The diodes 305, 306 are operated in the forward direction in accordance with FIG. 10. Since the diodes 315, 316 operated in the forward direction, first holes 1002 $h^+$ are injected into the n-type well region 401, which is illustrated by means of first current paths 1000. Since the strongly negative potential at the control gate 408, the positively charged first holes 1002 are accelerated toward the channel region 304, as a result of which the first holes 1002 are converted into "hot" second holes 1003. Since their sufficiently high kinetic energy, the second holes 1003 can pass right into the floating gate region 312, into which they are injected. By way of a shifting of the threshold voltage of the transistor like arrangement 400, it is possible to determine whether electrical charge carriers (namely holes) are injected in the floating gate 312 of the memory cell 400. A read current having a high or low value given a constant voltage between the source/drain regions 402, 403 may be assigned to an item of information having the logic value "1" or "0".

Figure 5:
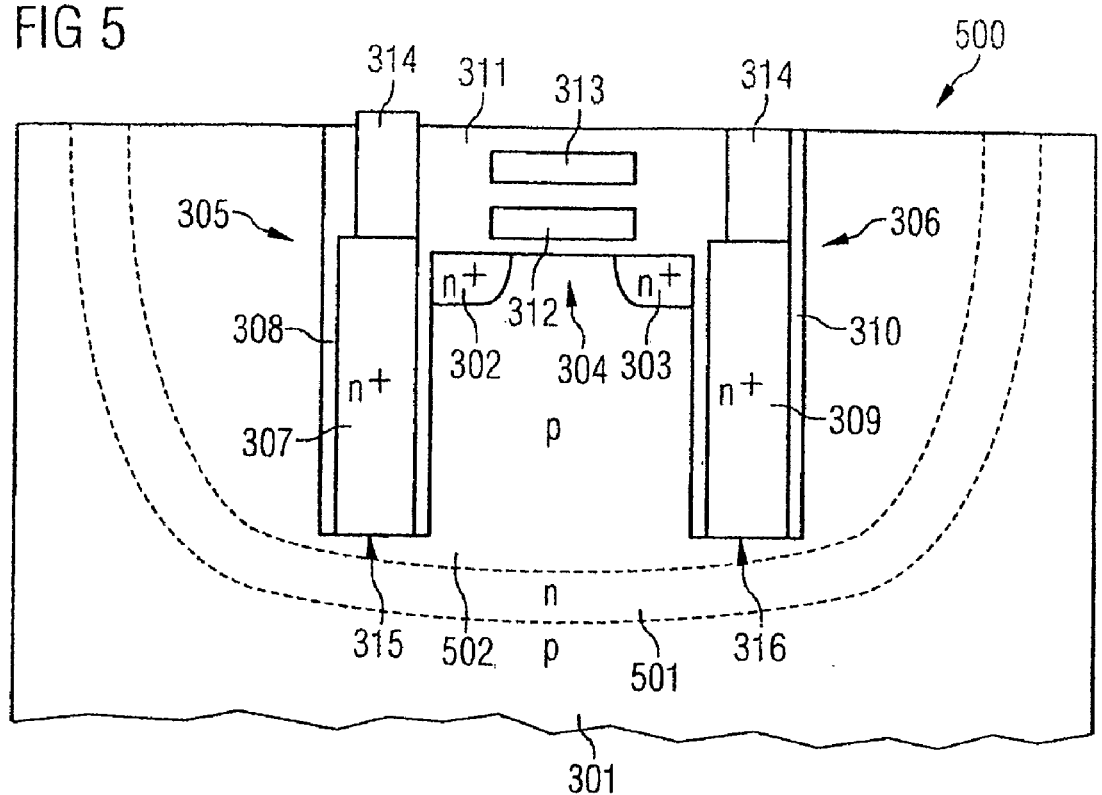
FIG. 5 shows an exemplary third embodiment of a memory cell.

FIG. 5 illustrates a third exemplary embodiment of a memory cell 500. The memory cell 500 may be formed in a p-doped small well region 502, which is in turn formed within an n-doped large well region 501. Accordingly, the memory cell may also be formed in a well region introduced in the substrate. In such a well construction, a negative potential can be applied to the (inner) p-type well. This means that the voltages applied to other regions are always to be seen in relation to this negative well potential.

Figure 6:
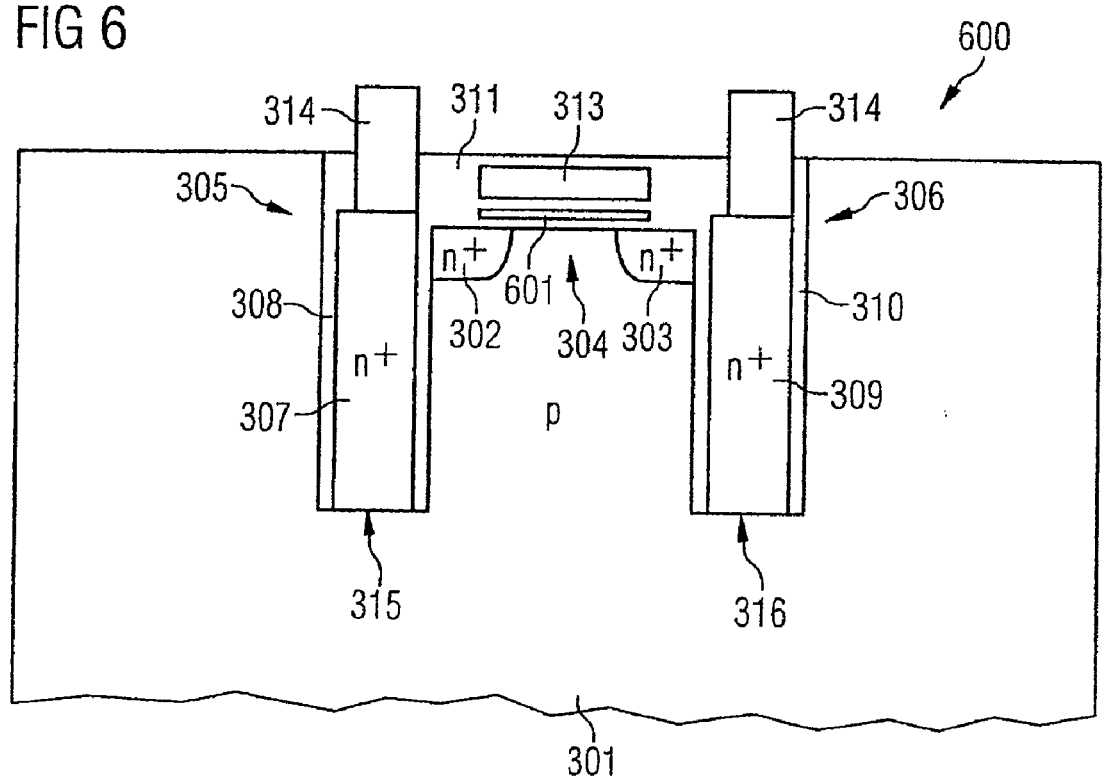
FIG. 6 shows an exemplary fourth embodiment of a memory cell.

FIG. 6 an exemplary fourth embodiment a memory cell 600. The memory cell 600 includes, as charge storage region, a silicon nitride layer ($Si_3N_4$) 601 embedded in sandwich-like fashion between two silicon oxide partial layers of the electrical insulation region 311, as a result of which an ONO layer sequence (silicon oxide/silicon nitride/ silicon oxide) is formed between the channel region 304 and the control gate 313. In the memory cell 600, the silicon nitride layer 601 of the ONO layer sequence is used as a "charge trapping layer" (e.g., as an electrically insulating charge storage region). The injection of electrons into the silicon nitride layer 601 may be effected in a manner similar to the injection of electrons into the floating gate 312 described for the memory cell 300. Since the electrical insulating property of silicon nitride material, the electrical charge carriers introduced into the silicon nitride layer 601 remain at the respective injection location within the silicon nitride layer 601 and may not be distributed freely over the charge storage region.

Figure 7:
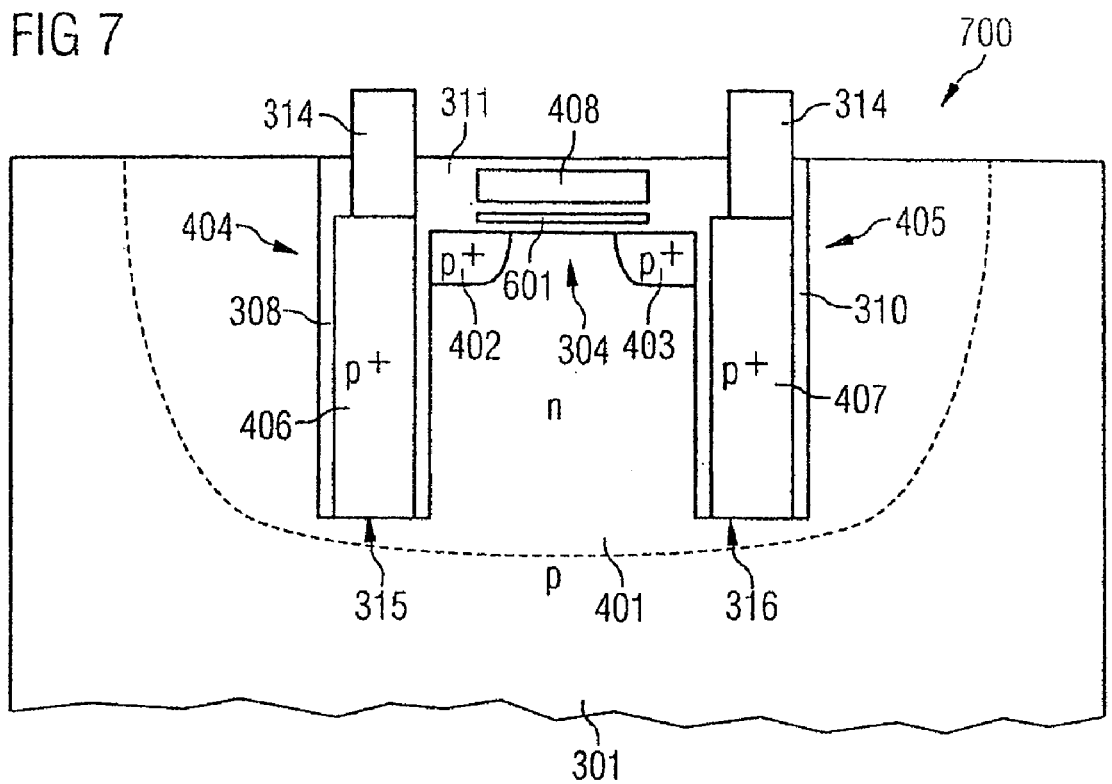
FIG. 7 shows an exemplary fifth embodiment of a memory cell.
Figure 8:
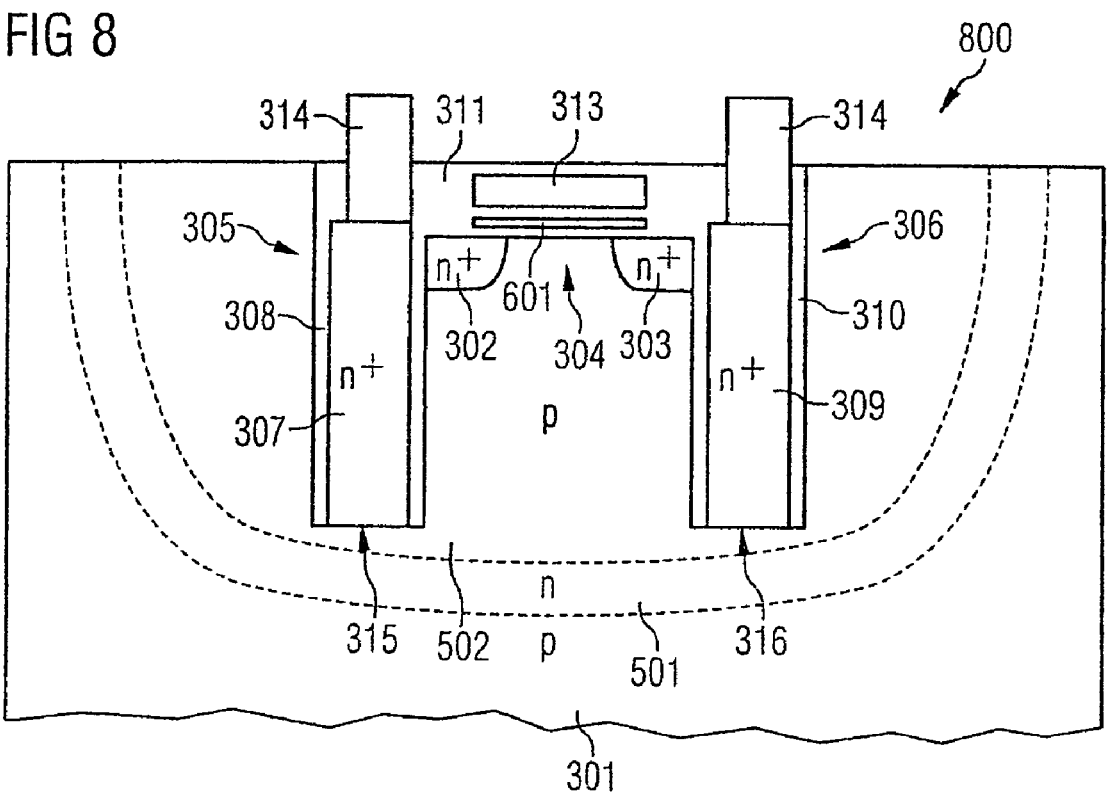
FIG. 8 shows an exemplary sixth embodiment of a memory cell.

FIG. 7 illustrates an exemplary fifth embodiment of a memory cell 700. The memory cell 700 is similar to the memory cell shown in FIG. 4 where the floating gate 312 is replaced by the silicon nitride layer 601 in the memory cell 700. FIG. 8 illustrates an exemplary sixth embodiment a memory cell 800. The memory cell 800 is similar to the memory cell 500 shown in FIG. 5 where the floating gate 312 is replaced by the silicon nitride layer 601.

Figure 11:
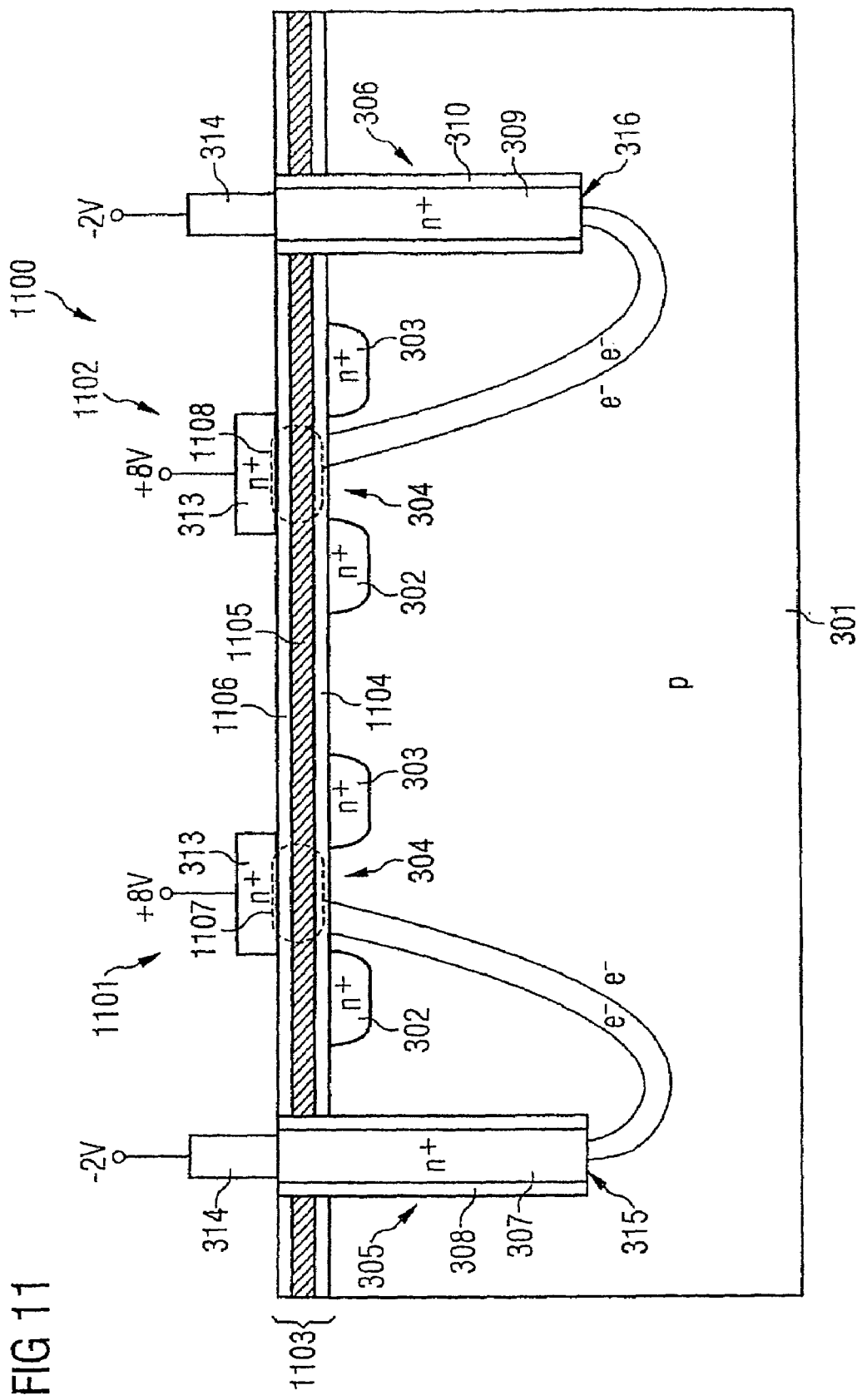
FIG. 11 shows an exemplary seventh embodiment of a memory cell.

FIG. 11 illustrates an exemplary seventh embodiment of a memory cell 1100. The memory cell 1100 shown in FIG. 11 is similar to the memory cell 600 shown in FIG. 6 where instead of only one memory field effect transistor in FIG. 6, a first memory field effect transistor 1101 and at least one second memory field effect transistor 1102 are formed in accordance with FIG. 11. The control gates 313 of the first and second memory field effect transistors 1101, 1102 can be driven separately. The control gates 313 of the two memory field effect transistors 1101, 1102 are spatially separated from one another and can be electrically driven separately. As charge storage region, the memory cell 1100 has an ONO layer sequence 1103 formed from a first silicon oxide layer 1104, a silicon nitride layer 1105 as "charge trapping layer" and a second silicon oxide layer 1106.

As described below, electrons can be introduced from the trench structures 305, 306 into the ONO layer sequence 1103 by means of the application of predeterminable electrical potential to the terminals of the memory cell 1100. A negative electrical potential of e.g. −2 volts is in each case applied to the n$^+$-doped polysilicon cores 307, 309 of the trench structures 305, 306. A positive electrical potential of e.g. +8 volts is in each case applied to the control gates 313 of the first and second memory field effect transistors 1101, 1102. On account of the potential conditions, the electrons emerging from the diodes 315, 316 are accelerated toward the channel regions 304 of the memory field effect transistors 1101, 1102 and injected in a first charge storage region 1107 and in a second charge storage region 1108 of the ONO layer sequence 1103. This method step may be referred to as a resetting of the memory contents of the field effect transistors 1101, 1102.

To program an item of memory information of one bit selectively into a selected one of the first and second charge storage regions 1107 or 1108, the electrons introduced into the respective charge storage region 1107 or 1108 by way of the injection of hot electrons are selectively removed by means of Fowler-Nordheim tunneling. In this case, the spatial resolution of Fowler-Nordheim programming can be advantageously utilized in the introduction/removal of charge carriers. Consequently, in the case of the memory cell 1100, it is possible for different memory field effect transistors of the memory cell to be written to separately from one another. As a result, the memory cell of the invention can be realized as a multiple-bit memory cell, for example as a two-bit memory cell as in FIG. 11. Different regions of the ONO layer sequence 1103 may be operated as charge storage layer for the separate introduction/removal of electrical charge carriers and thus as separate information bit storage regions.

An advantageous procedure for the operation of memory cell 1100 includes firstly resetting all of the memory cells by the injection of charge carriers (e.g. by the tunneling of hot charge carriers) into the charge storage layer 1103. Information is then programmed using a location-specific removal of charge carriers from a selected region of the charge storage layer, e.g. by means of Fowler-Nordheim tunneling. Alternatively or in addition, hot charge carriers can be injected selectively by putting one control gate at a positive potential, as described, and leaving the other control gate at substrate or well potential. The charge carriers are selectively accelerated only to one gate, a selective programming thereby being obtained. The implementation described in FIG. 11 is likewise possible analogously with the well constructions presented in FIG. 7 and FIG. 8.

Figure 12:
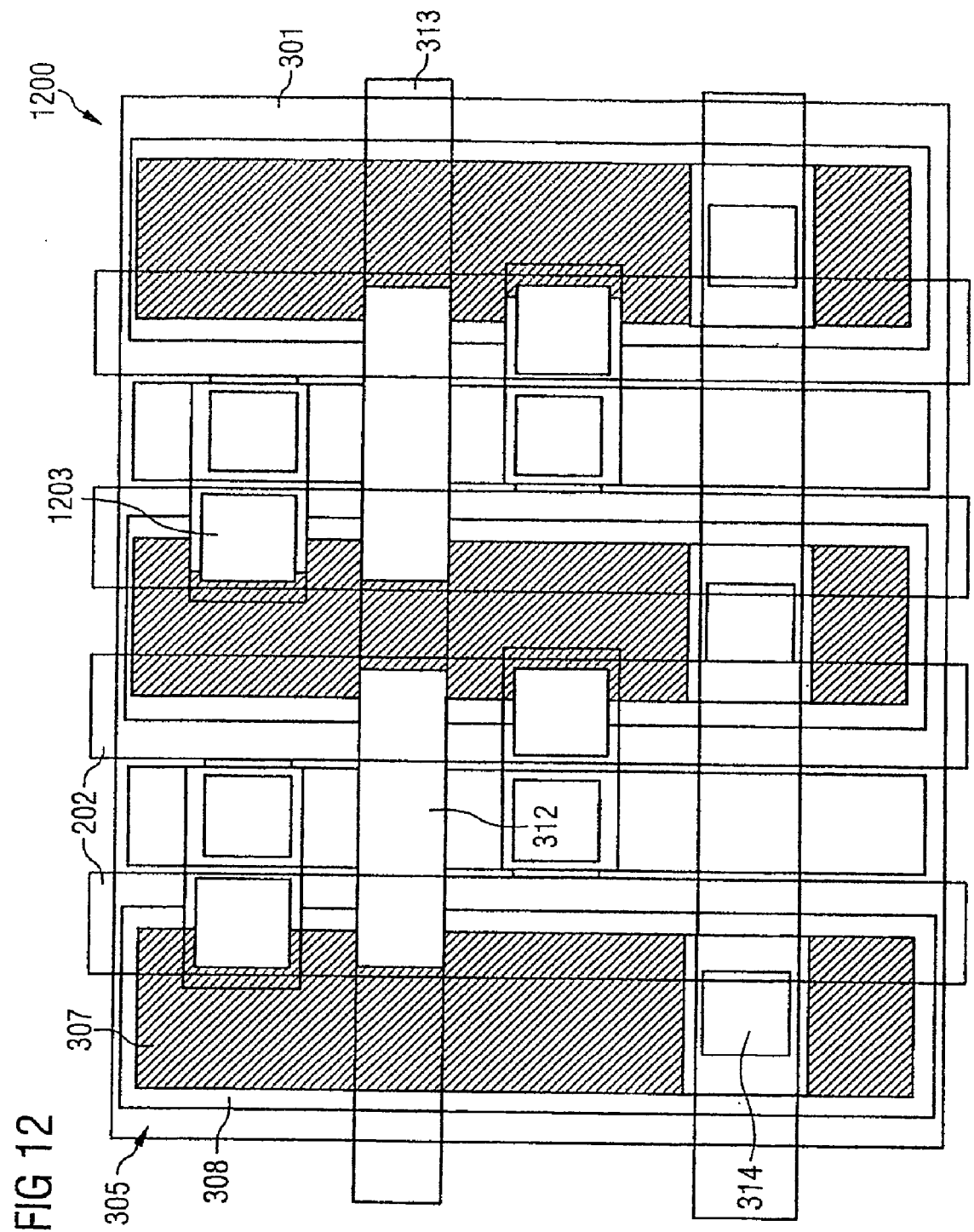
FIG. 12 shows an exemplary layout view of a memory cell arrangement.

FIG. 12 illustrates a schematic layered view (plan view) of a memory cell arrangement 1200. The memory cell arrangement 1200 includes multiple memory cells such as are shown for example in FIG. 3. For the sake of clarity, reference symbols from FIG. 3 have been inserted in FIG. 12. The memory cell arrangement 1200 is realized as SNOR architecture.

The control gate 313 is embodied jointly for a row of memory cells in FIG. 12, and is thus realized in a similar manner to an interconnect. By way of a substrate contact-connection (not depicted in FIG. 12), a defined electrical potential can be provided to the substrate 301. Furthermore, interconnects 1202 and interconnect vias 1203 or contact holes 1201 are shown, by means of which the source/drain regions can be contact-connected.

Figure 13:
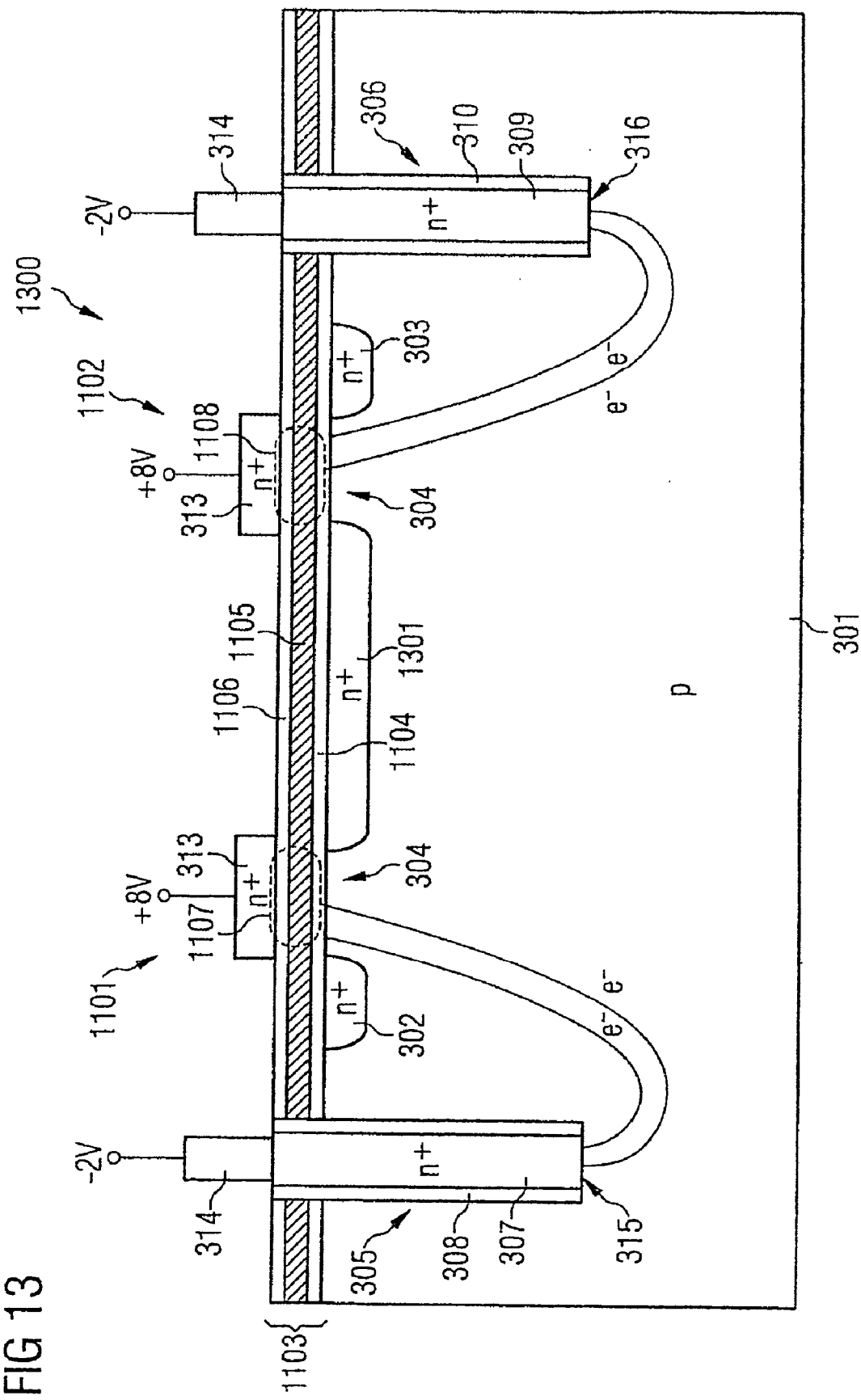
FIG. 13 shows an exemplary eighth embodiment of a memory cell.

FIG. 13 illustrates an exemplary eight embodiment of memory cell 1300. The memory cell 1300 is similar to the memory cell 1100 where the right-hand source/drain region in accordance with FIG. 11, (i.e. the second source/drain region 303 of the first memory field effect transistor 1101) is embodied with the left-hand source/drain region in accordance with FIG. 11, (i.e. the second source/drain region 302 of the second memory field effect transistor 1102) as a common source/drain region 1301. The common source/drain region 1301 thus represents a contiguous implantation zone. Such a combination of two source/drain regions of two adjacent memory cells can also be realized for a memory cell arrangement having a multiple memory cells. If the source/drain zones 303, 302 are combined, a type of NAND structure is obtained.

Figure 14:
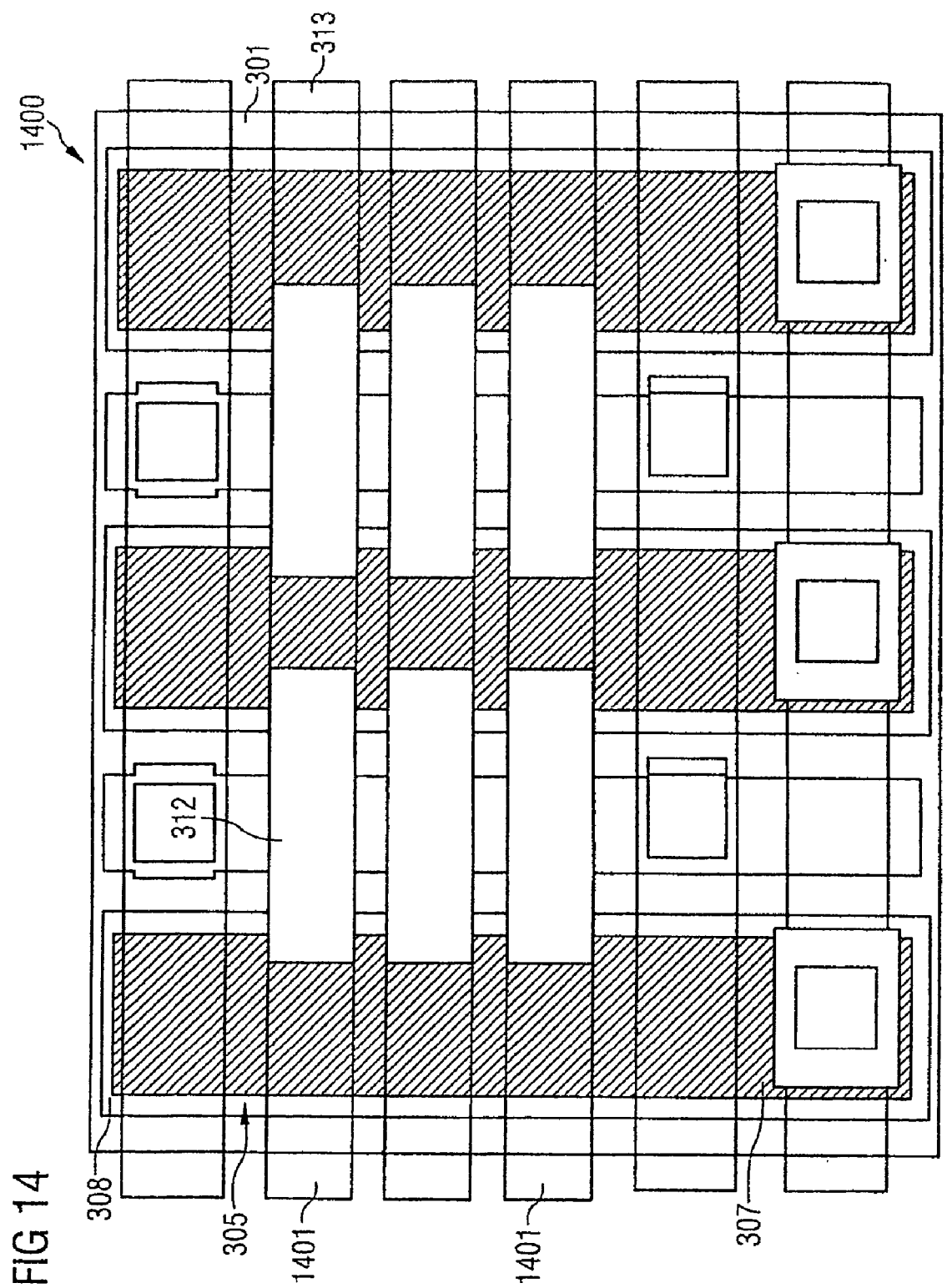
FIG. 14 shows another exemplary layout view of a memory cell arrangement.

Referring to FIG. 14 a schematic layered view (plan view) of a memory cell arrangement 1400 of another exemplary embodiment is shown where interconnects 1401 are provided in the memory cell arrangement. The memory cell arrangement 1400 from FIG. 14 represents a schematic layout that reveals how memory cells according to the invention may be integrated into a NAND structure. An integration into other arrangements (e.g. NOR, . . . ) is also possible. Therefore, the examples shown are intended to serve only for illustration without effecting a restriction to a specific memory arrangement.

The memory cells, memory cell arrangements and methods for producing memory cells explained above introduces advantages for integrated circuit storage devices. In addition, other memory cells, memory cell arrangements, and methods for producing memory cells may be utilized without any restriction.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A memory cell, comprising
a substrate of charge carriers of a first conduction type;
a first source/drain region in a first surface region of the substrate;
a second source/drain region in a second surface region of the substrate;
a channel region in the substrate between the first and the second source/drain region;
a charge storage region above the channel region;
a control gate above the charge storage region, the control gate being is electrically insulated from the charge storage region; and
a trench structure formed in the substrate, the trench structure having charge carrier supplying material with charge carriers of a second conduction type and an insulation region between the substrate and at least one part of the charge carrier supplying material, the trench structure being at least partially provided with a shallow trench sidewall isolation,
where the first conduction type is different from the second conduction type, to form a diode junction between the substrate and the charge carrier supplying material of the trench structure, and the memory being configured so that by an application of predeterminable electrical potentials to the memory cell, electrical charge carriers can be introduced from the charge carrier supplying material of the trench structure into the charge storage region.

2. The memory cell of claim 1, where the trench structure extends deeper into the substrate than the first and the second source/drain region.

3. The memory cell of claim 2, where the trench structure extends deeper into the substrate than the first and the second source/drain region at least by a factor of three.

4. The memory cell of claim 1, where the trench structure extends in a substantially vertical direction with respect to the surface of the substrate.

5. The memory cell of claim 1, where the trench structure is configured laterally with respect to at least one of the source/drain regions and outside the channel region.

6. The memory cell of claim 1, further comprising at least two trench structures, at least one being configured laterally with respect to the first source/drain region and outside the channel region and the other being configured laterally with respect to the second source/drain region and outside the channel region.

7. The memory cell of claim 1, where the trench structure comprises an electrically insulating sheath region on at least one part of a sidewall of the trench and an electrically conductive core region filled into the trench, so that electrical charge carriers can emerge from the trench structure into the substrate from those regions in which the core region is substantially free of a sheathing with the sheath region.

8. The memory cell of claim 1, where the trench structure comprises an electrically insulating sheath region on at least one part of a sidewall of the trench and an electrically conductive core region filled into the trench, so that electrical charge carriers can emerge from the trench structure into the substrate from those regions in which the sheath region has a sufficiently small thickness to enable a tunneling current.

9. The memory cell of claim 1, where the charge storage region comprises a floating gate of polysilicon material.

10. The memory cell of claim 9, further comprising a gate insulating layer arranged between the substrate and the floating gate.

11. The memory cell of claim 1, where the charge storage region comprises an electrically insulating charge storage region having a layer sequence configured for substantially permanent charge storage.

12. The memory cell of claim 11, where the electrically insulating charge storage region is any one of a silicon oxide/silicon nitride/silicon oxide layer sequence, silicon nitride, aluminum oxide, yttrium oxide, lanthanum oxide, hafnium oxide, zirconium oxide, a silicon oxide/aluminum oxide/silicon oxide layer sequence, a silicon oxide/yttrium oxide/silicon oxide layer sequence, a silicon oxide/lanthanum oxide/silicon oxide layer sequence, a silicon oxide/hafnium oxide/silicon oxide layer sequence, a silicon oxide/zirconium oxide layer sequence, and combinations thereof.

13. The memory cell of claim 1, where the substrate has a well region having the charge carriers of the first conduction type and a region having charge carriers of the second conduction type, the components of the memory cell being formed in the well region.

14. The memory cell of claim 1, having a plurality of control gates being spatially separated and configured to be electrically driven separately, so that an application of predeterminable electrical potentials to at least one selected control gate from said plurality control gates, electrical charge carriers can be introduced from the trench structure into a region of the charge storage region that is adjacent to the at least one selected control gate.

15. The memory cell of claim 1, where the charge carriers of the first conduction and the second conduction type comprise doping atoms.

16. A memory cell of claim 1 comprising a plurality of memory cells integrated in the substrate.

17. The memory cell of claim 16, comprising memory cells electrically decoupled from one another by the electrically insulating sheath regions.

18. A method for the production of a memory cell, comprising
forming a first source/drain region in a first surface region of a substrate having charge carriers of a first conduction type, and a second source/drain region in a second surface region of the substrate, the first source/drain region and the second source/drain region defining a channel regions in a surface region of the substrate between the first and the second source/drain region;
forming a charge storage region above the channel region;
forming a control gate above the charge storage region the control gate being electrically insulated from the charge storage region; and
forming a trench structure in the substrate, the trench structure having charge carrier supplying material with charge carriers of a second conduction type and an insulation region between the substrate and at least one part of the charge carrier supplying material, the trench structure being at least partially provided with a shallow trench sidewall isolation,
where the first conduction type is different from the second conduction type to form a diode junction between the substrate and the charge carrier supplying material of the trench structure, and the memory cell is configured so that by an application of predeterminable electrical potentials to the memory cell, electrical charge carriers can be introduced from the charge carrier supplying material of the trench structure into the charge storage region.

19. The method of claim 18, where forming the trench structure comprises:
   forming at least one trench in the substrate;
   forming an electrically insulating sheath region at least on a part of the surface of the at least one trench; and
   forming an electrically conductive core region at the at least one trench.

20. The method of claim 18, where forming the trench structure comprises:
   forming at least one trench in the substrate;
   filling the trench with electrically insulating material;
   removing a part of the electrically insulating material from the trench as a result of which the electrically insulating sheath region is formed; and
   forming an electrically conductive core region in the at least one trench.

21. A method for the production of a memory cell, comprising
   defining a channel region at a surface of a substrate, the channel being defined between a first source/drain region in the substrate having charge carriers of a first conduction type, and a second source/drain region in the substrate;
   applying a charge storage region at the channel region, a control gate being provided above the charge storage region and being electrically insulated from the charge storage region;
   forming a trench structure in the substrate having charge carriers of a second conduction type being introduced to the charge storage region from a charge carrier supplying material, the second conduction type being difference from the first conduction type and forming a junction between the substrate and the charge carrier supplying material; and
   forming an insulation region between the substrate and at least one part of the charge carrier supplying material, the trench structure being at least partially provided with a shallow trench sidewall isolation.

22. A memory cell having a substrate material having of charge carriers of a first conduction type, and including a a channel region in the substrate between a first source/drain region and a second source/drain region; the memory cell comprising
   a charge storage means arranged proximate the channel region;
   a control gate being electrically isolated from the charge storage means and arranged above the charge storage region;
   a trench having a shallow trench sidewall isolation in the substrate and charge carriers of a second conduction type being introduced from a charge carrier supplying material of the trench into the charge storage means, the second conduction type differing from the first conduction type, a diode junction between the substrate and the charge carrier supplying material of the trench structure being formed; and
   an insulator arranged between the substrate and at least one part of a charge carrier supplying material.

23. The memory cell of claim 22, where the trench structure extends deeper into the substrate than the first and the second source/drain region at least by a factor of three.

24. The memory cell of claim 22, where the trench comprises an electrically insulating sheath on at least one part of a sidewall of the trench, and a conductive core filled in the trench, so that electrical charge carriers emerge from the trench structure into the substrate from regions enabling a tunneling current.

25. The memory cell of claim 22, where the charge storage means comprises a layer sequence configured for substantially permanent charge storage.

* * * * *